United States Patent [19]
Anthon

[11] Patent Number: 6,125,222
[45] Date of Patent: Sep. 26, 2000

[54] FIBER GRATING FEEDBACK STABILIZATION OF BROAD AREA LASER DIODE

[75] Inventor: Douglas W. Anthon, Wheaton, Ill.

[73] Assignee: Scientific-Atlanta, Inc., Norcross, Ga.

[21] Appl. No.: 09/063,837

[22] Filed: Apr. 21, 1998

[51] Int. Cl.$^7$ ..................................................... G02B 6/32
[52] U.S. Cl. .................................. 385/33; 385/37; 372/29
[58] Field of Search ................................. 385/14, 15, 31, 385/33–35, 37, 39; 372/29, 32

[56] References Cited

U.S. PATENT DOCUMENTS

| | | | |
|---|---|---|---|
| 4,699,465 | 10/1987 | Rice et al. | 359/558 |
| 4,726,645 | 2/1988 | Yamashita et al. | 385/35 |
| 4,786,132 | 11/1988 | Gordon | 385/38 |
| 4,911,516 | 3/1990 | Palfrey et al. | 385/37 |
| 4,914,665 | 4/1990 | Sorin | 372/20 |
| 5,317,447 | 5/1994 | Baird et al. | 359/328 |
| 5,319,435 | 6/1994 | Melle et al. | 356/32 |
| 5,321,718 | 6/1994 | Waarts et al. | 372/108 |
| 5,485,481 | 1/1996 | Ventrudo et al. | 372/6 |
| 5,513,196 | 4/1996 | Bischel et al. | 372/22 |
| 5,530,709 | 6/1996 | Waarts et al. | 372/6 |
| 5,537,432 | 7/1996 | Mehuys et al. | 372/50 |
| 5,559,824 | 9/1996 | Baird et al. | 372/95 |
| 5,572,542 | 11/1996 | Dixon | 372/92 |
| 5,589,684 | 12/1996 | Ventrudo et al. | 250/225 |
| 5,627,848 | 5/1997 | Fermann et al. | 372/18 |
| 5,638,214 | 6/1997 | Doric | 359/654 |
| 5,859,945 | 1/1999 | Kato et al. | 385/89 |
| 5,923,359 | 7/1999 | Montogomery | 347/255 |

FOREIGN PATENT DOCUMENTS

WO 98/15994    4/1998    WIPO .

OTHER PUBLICATIONS

Temmyo et al., "Improved Coupling Efficiency of a Strained InGaAs–AlGaAs Quantum–Well Laser Into a Fiber Bragg Grating," IEEE Photonics Technology Letters, vol. 9, No. 5, May 1997, p.p.581–583, XP 000677330.

Yamashita J., "Semiconductor Laser Equipment and Optical Amplifier," Japanese Patent Abstract, Pub No. 09148660, Jun. 6, 1997.

*Primary Examiner*—John D. Lee
*Assistant Examiner*—Michelle R. Connelly-Cushwa
*Attorney, Agent, or Firm*—Kelly A. Gardner; Kenneth M. Massaroni; Hubert J. Barnhardt, III

[57] ABSTRACT

The laser device of the present invention includes a high-power, fiber-coupled optical source (FIG. 1) having a broad area laser diode (10) with a high reflective coating at its rear facet (12), coupling optics (20), and an optical fiber (30) having fiber grating (32). The fiber grating (32) serves to reflect a portion of the optical beam back to the broad area laser diode (10), thereby stabilizing the wavelength of the optical beam. The fiber grating (32) and the rear facet (12) of the broad area laser diode (10) serve as nodes for an external resonator, thereby limiting the diffraction of the optical beam. The effects of wavelength fluctuation and beam diffraction are reduced together using minimal mechanical components.

17 Claims, 4 Drawing Sheets

FIBER GRATING FEEDBACK STABILIZATION OF BROAD AREA LASER DIODE

FIELD OF THE INVENTION

This invention relates to stabilization of laser sources, and more particularly relates to wavelength and beam quality stabilization of broad area laser diodes using fiber grating feedback.

DESCRIPTION OF THE RELATED ART

The use of lasers is becoming increasingly widespread in optical communications systems. Of particular importance are laser diodes which are capable of providing high optical output power. A conventional laser diode consists of a planar semiconductor waveguide material with the end facets cleaved to form the resonator mirrors. The width of the resonator is typically determined by the width of the stripe electrical contact used to inject current, with refractive index steps being used in some cases as well. The beam profile in the "fast" axis of the aperture is defined by the waveguide index profile of the semiconductor material, while in the "slow" axis, the emitting aperture is determined by the stripe width. The stripe width is usually limited to a few micrometers to ensure operation in a single transverse mode with good beam quality. This small aperture leads to high power densities that typically cause optical damage if the output power exceeds about 150 milliwatts. This can be avoided by increasing the emitting aperture. A broad area laser diode has a much wider stripe, up to perhaps 300 micrometers, giving a large rectangular aperture. This allows powers up to 3 Watts to be achieved, but at the price of degraded beam quality. The device no longer operates in a single transverse mode, and the output is not diffraction limited. This ordinarily prevents these devices from being efficiently coupled to single mode optical fiber.

Both narrow and broad area laser diode also suffer from wavelength fluctuation. In applications that require laser emissions at a single predetermined wavelength, it therefore becomes necessary to stabilize the operating wavelength of the laser. One technique for wavelength control is to filter the light emitted from the laser source and feed the filtered light back to the laser cavity. This feedback can have the effect of favoring resonance at the filtered bandwidth, which can dominate the laser output. Accordingly, wavelength selective feedback can cause the laser to oscillate at a single predetermined wavelength. Wavelength stabilization of the laser is accomplished by controlling the wavelength of the filtered feedback signal. In the case of laser diodes, this feedback may be provided from external optics, thereby forming an external cavity laser.

In one form of external cavity laser, an optical signal is output from the laser, collimated with a lens, and coupled to an optical fiber containing a Bragg grating. Bragg gratings are typically formed holographically, by exposing a germanium-containing fiber to ultraviolet light through a phase mask. The grating provides a narrow band reflected signal that is spatially matched to the optical mode of the fiber, and that can be coupled back to the diode with the lens to form an external resonant cavity. This use of fiber gratings has been described by E. Brinkmeyer et al. in "Fibre Bragg Reflector for Mode Selection and Line-Narrowing of Injection Lasers," Electronic Letters, Vol. 22, No. 3, Jan. 30, 1986, pp. 134–35. A more extensive discussion of fiber gratings and their applications can be found in R. Kashyap, "Photosensitive Optical Fibers: Devices and Applications," Optical Fiber Technology, Vol. 1, No. 1, 1994, pp. 17–34, and is included by reference.

In addition to wavelength fluctuations, broad area lasers also suffer from poor beam quality in the slow axis. A number of schemes have been proposed for overcoming this difficulty. One approach is to take the diffraction-limited output of a narrow stripe master oscillator and to amplify it to the required power in a semiconductor amplifier. Ideally, the beam quality of the master oscillator is preserved in the amplifier, providing a high power diffraction-limited output. As a device, this has taken the form of an integrated master oscillator/power amplifier (MOPA), where the master oscillator and a tapered power amplifier monolithically integrated into a single chip. The device is somewhat complex, requiring, for example, separate current sources for the master oscillator and for the amplifier. However, practical uses for these lasers are limited, since existing devices have exhibited relatively short lifetimes. The properties of MOPA semiconductor lasers are reviewed by R. Parke, D. F. Welch, S. Obrien, and R. Lang, "3.0 W cw diffraction limited performance from a monolithically integrated master oscillator power amplifier" in Conference on Lasers and Electro-Optics Technical Digest Series 1993, vol. 11 (Optical Society of America, Washington D.C., 1993) paper CTuI4, pp. 108.

An alternative technique involves modifying the laser resonator to support a larger optical mode. In a conventional resonator, the transverse mode is determined by the mirror curvature, the resonator length and the intracavity lens determined by a variety of thermal and carrier-density effects. One technique for increasing the mode size in a semiconductor laser is to replace the planar cleaved facets with convex reflectors, giving an unstable resonator semiconductor laser. This technique is described by Stephen A. Biellak, C. Geoff Fanning, Yan Sun, S. Simon Wong and Anthony E. Siegman in "Reactive-Ion-Etched Diffraction-Limited Unstable Resonator Semiconductor Lasers," IEEE Journal of Quantum Electronics, Vol. 33, No.2 (February 1997). Relatively large output powers with good beam quality have been achieved with this technique, but it has proven to be a difficult and expensive process to produce the required high quality curved reflectors, so the devices are not widely used.

It is also possible to increase the mode size by coupling the broad area laser device to an external resonator. One example of an external resonator is described by C. Chang-Hasnain, J. Berger, D. R. Scifres, W. Streifer, J. R. Whinnery and A. Dienes in "Narrow Single Lobed Emission With High Power and High Efficiency From An External Cavity Coupled Laser Array," in Conference on Lasers and Electro-Optics Technical Digest Series 1987, vol. 14 (Optical Society of America, Washington D.C., 1987) paper ThT11, pp. 247–48. Although such external resonators have shown promising results, they have rarely been used because of the level of mechanical stability required to ensure proper operation of the external resonator.

Whatever the form of the resonator, it is necessary to couple the laser output to a single mode optical fiber if it is to be used in a fiber optic system. This requires extreme mechanical stability to ensure that the optical beam is properly directed into the optical fiber. Therefore, in applications which employ an external resonator to control the beam quality of a broad area laser diode output, two levels of mechanical stability are required. Furthermore, a form of feedback can be required to provide wavelength stability. It is shown here that it is possible to achieve these requirements simultaneously with a minimum of mechanical complexity by employing fiber gratings in an external resonator.

It is therefore an object of the present invention to stabilize the wavelength and beam quality of broad area lasers diodes with minimal mechanical complexity.

It is another object of the present invention to combine the wavelength stabilization and beam quality stabilization mechanisms in a high-powered, fiber coupled laser source.

It is yet another object to incorporate a fiber grating in an optical fiber with an external resonator for a broad area laser diode.

BRIEF DESCRIPTION OF THE DRAWINGS

These and other advantages and features of the invention will become apparent upon reading the following detailed description and referring to the accompanying drawings in which like numbers refer to like parts throughout and in which.

DESCRIPTION OF THE PREFERRED EMBODIMENTS

The foregoing techniques also may be applied to all electrically excitable semiconductor lasers. Those skilled in the art will recognize that the preferred embodiments may be altered and amended without departing from the true spirit and scope of the appended claims.

Figure 1:
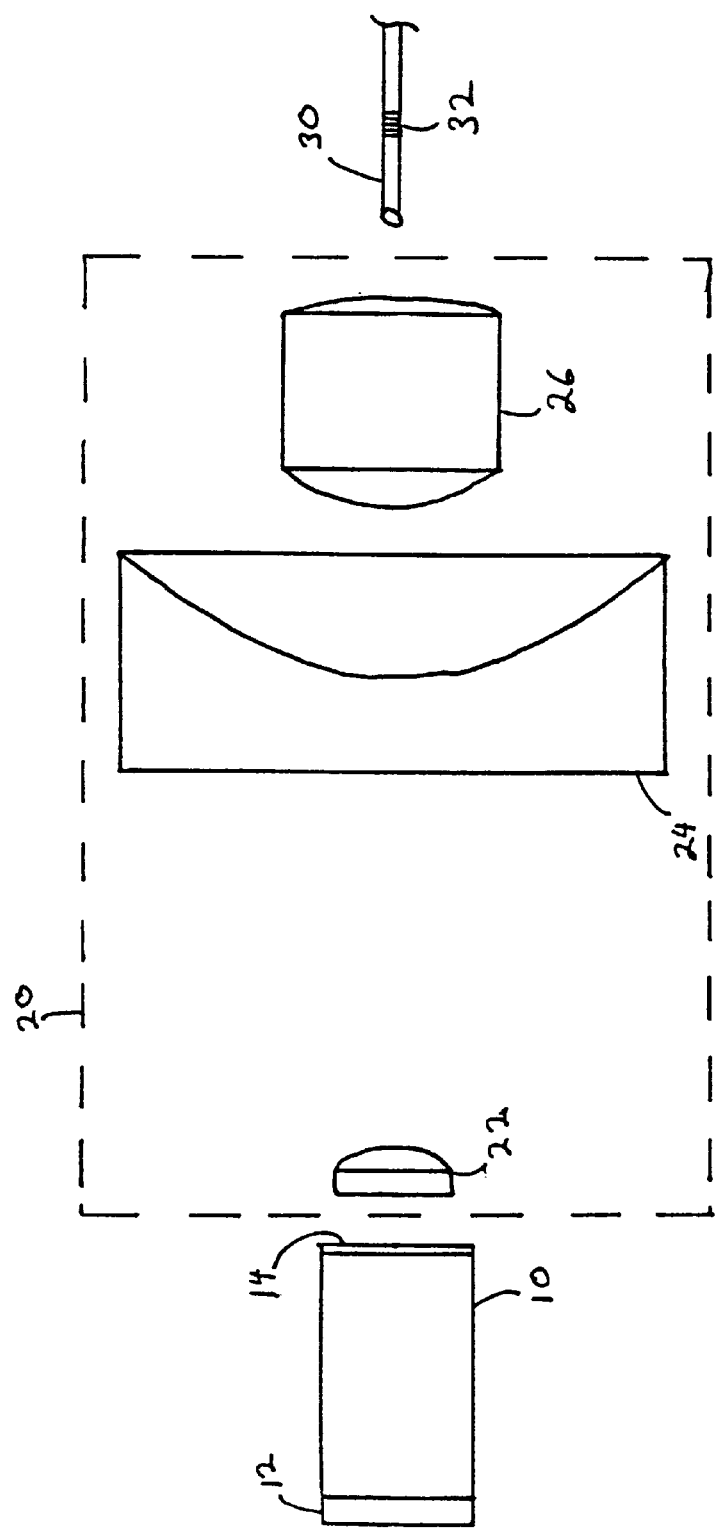
FIG. 1 is a schematic front view diagram of a high-powered, fiber-coupled laser source in accordance with the present invention.

FIG. 1 is a schematic diagram of a preferred embodiment of the present invention. The system preferably consists of a broad area laser diode 10, coupling optics 20, and an optical fiber 30. The broad area laser diode 10 has a front facet 14 and a rear facet 12. The broad area laser diode 10 preferably has a rectangular aperture (not shown) at the front facet 14 such that it outputs an asymmetric optical beam 50 (FIGS. 3 and 4) from the front facet 14. The coupling optics 20 include a first lens 22, a second lens 24, and a third lens 26. The optical fiber 30 contains a fiber grating 32 configured so as to reflect a spatially and spectrally filtered portion of the incident beam back through the lenses to the laser diode, thereby creating feedback to stabilize the wavelength and transverse mode of the optical beam. The feedback occurring within the resonator defined by the reflective surfaces 12, 14 and the reflective grating 32 is such that the optical power coupled to the optical fiber 30 is greater than would be the case in the absence of the grating 32. Ideally, the feedback signal will be larger than the signal reflected off the front facet 14. In this case, the device will appear as a laser operating in the resonator defined by either or both of the facets 12,14 and the fiber grating 32, with the reflection off of front facet 14 being a small perturbation. If the reflection off surface 14 is too large, the laser may revert to operating in the modes defined by the cleaved facets. The optical fiber 30 is single mode at the typical diode wavelength of 980 nm, typically has a round cross-section or fiber profile, and is typically doped with germanium to allow efficient writing of the Bragg grating. However, other fiber profiles or wavelengths may also be implemented under the present invention. A suitable fiber for use at 980 nm would be Flexcore 1060 made by Corning, Inc. (Corning, N.Y. 14831).

Figure 2:
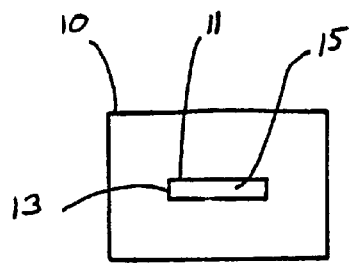
FIG. 2 depicts a right side view of the broad area laser diode in accordance with the present invention.

FIG. 2 depicts a right side view of a broad area semiconductor laser 10. Such devices are manufactured by SDL, Inc. (80 Rose Orchard Way, San Jose, Calif. 95134) and also by OPTO POWER Corp. (3321 East Global Loop, Tucson, Ariz. 85706) at wavelengths between 790 nm and 980 nm. The broad area laser diode 10 has an aperture 15 through which an optical beam (not shown) is emitted. The aperture 15 has a narrow dimension 13 and a broad dimension 11. The geometry of the aperture 15 generally reflects the geometry of the beam profile of the optical beam at the point where it is emitted from the broad area laser diode 10. The optical beam therefore has a corresponding narrow side and a broad side, commonly referred to as the fast and slow axes, respectively.

The emitting aperture 15 determines the beam quality, which is defined by the product of the beam divergence angle and the width of the emitting aperture 15. For a given aperture and wavelength, a minimum divergence angle is determined by diffraction considerations, and divergence angles larger than this diffraction-limited angle indicate reduced beam quality.

The purpose of the coupling optics 20 is to introduce as much optical light into the optical fiber 30 as possible. In terms of the lens requirements, this is equivalent to matching the round output of the optical fiber 30 to the rectangular emitting aperture of the laser diode 10. Therefore, some form of astigmatic optical lenses are preferably implemented to transform the round fiber beam into an elliptical beam that is matched to the rectangular output aperture. In the forward direction, the emission from the laser diode 10 is gaussian in the fast axis, and the appropriate focusing system will match this output beam to the gaussian mode of the optical fiber. In the slow axis, the output of the diode 10 is not ordinarily gaussian. In this axis, the focusing optics are preferably chosen so that the rear facet of the laser diode 10 and the fiber grating 32 define the ends of an external resonator that supports the desired gaussian mode in the broad area device. This corresponds to manipulating the spatial profile of the optical beam such that the gaussian fiber mode is transformed into the desired gaussian laser mode. If the modes are matched, then fiber grating 32 in the optical fiber 30 enhances the gain for that mode and causes it to predominate.

Referring back to FIG. 1, lenses 22 and 26 are preferably aspheric lenses, models 350140 and 350350, respectively, made by GELTECH, Inc. (1 Progress Blvd. #8 Alachua, Fla. 32615). The lenses 22 and 26 are preferably antireflection coated at 980 nm and have focal lengths of 1.45 mm and 4.50 mm, respectively. Lens 24 is preferably a cylinder lens model 01-LCP-125 that is made by Melles-Griot, Inc. (1770 Kettering Street, Irvine, Calif. 92714) and that is antireflection coated at 980 nm. Lens 24 also has a focal length of 13.05 mm at 980 nm. Note that the cylinder lens is shown in its afocal orientation, and that the curve shown corresponds to the intersection of the cylindrical surface with the round lens diameter. This combination of lenses is preferred due to the ease of implementation and relative mechanical simplicity. However, it will be appreciated by one skilled in the art that the present invention can be practiced with any number of other combinations of lenses or mirrors which serve to focus the optical beam into the optical fiber 30. In particular, an all reflective system may be preferable to eliminate any spurious feedback from the lens surfaces. Note that the end of the fiber 30 is angled to avoid any back reflections.

Figure 3:
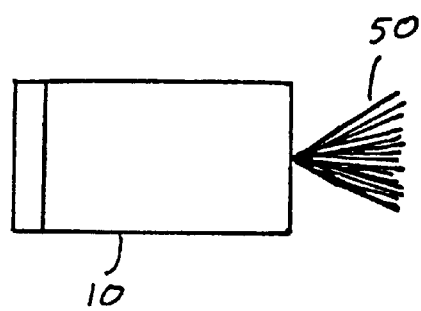
FIG. 3 shows a side view of the optical beam as it is emitted from the broad area laser diode along its narrow side in accordance with the present invention.
Figure 4:
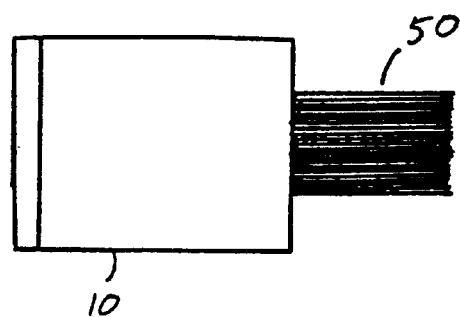
FIG. 4 depicts a top view of the optical beam as it is emitted from the broad area laser diode along its broad side in accordance with the present invention.

FIG. 3 and FIG. 4 show side and top views, respectively, of the optical beam 50 that would be emitted from the aperture 15 if the beams were diffraction limited. The large divergence in FIG. 3 is a direct consequence of the small dimension of the emitting aperture 13, and the large divergence corresponds closely to the output of an actual device. The low divergence of the beam in FIG. 4 results from the large dimension of 11. In an actual device without an external resonator, the divergence would be substantially larger than that shown. Note that the diode output is not strongly dependent on the diode design, and that the broad area diode might also be comprised of a multi-stripe diode array or a tapered amplifier. Note that it is also possible to change the diode output somewhat by flaring the waveguide at the ends of the resonator, or by adjusting the width or end face curvature to reduce the divergence of the beam. Diodes modified in these ways may also be usefully adapted to this invention.

Figure 5:
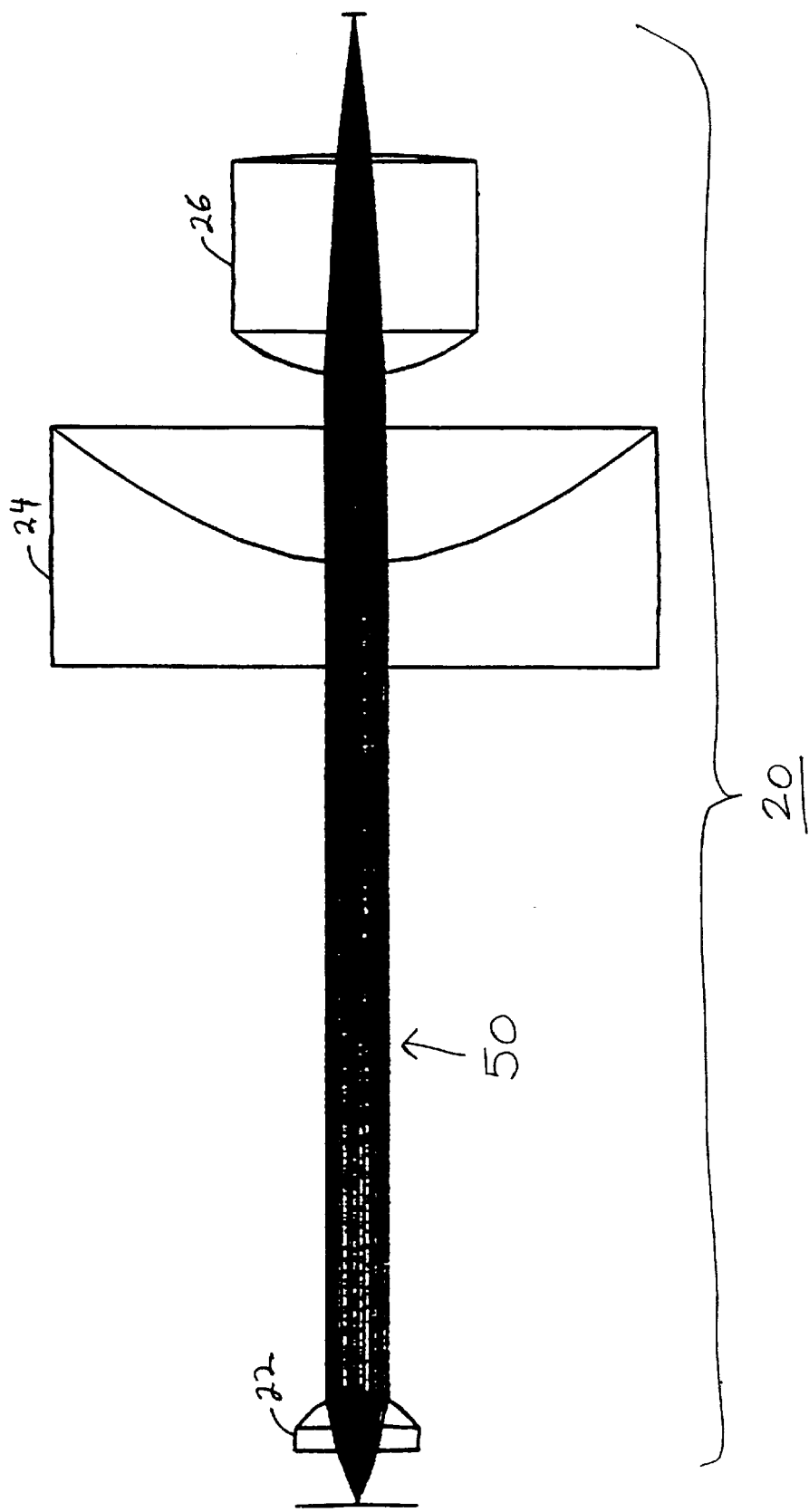
FIG. 5 shows a side view of the path of the optical beam along its narrow side as it passes through the coupling optics in accordance with the present invention.

FIG. 5 shows the output beam 50 and the coupling optics 20 from the same perspective as that of FIG. 3. In this view, the highly divergent optical beam 50 is collimated by the lens 22 and then focused by lens 26 into the optical fiber 30. This arrangement gives a threefold reduction in the divergence and approximately matches the diode mode field to that in a typical 980 nm optical fiber, such as a Corning Flexcore 1060 fiber. Note that different diodes and fibers have different mode fields and that different focal lengths may be appropriate for other combinations of diodes and fibers.

Figure 6:
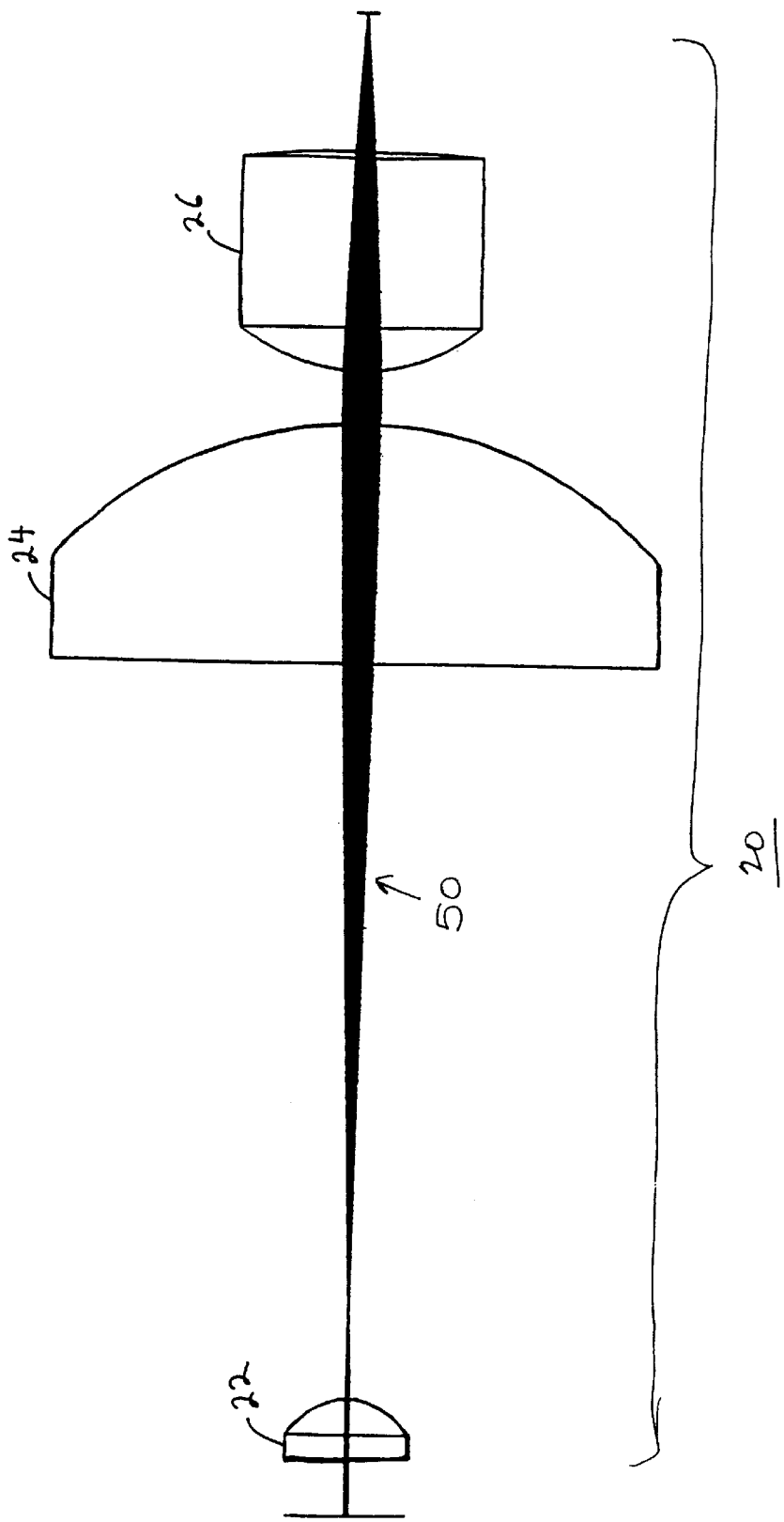
FIG. 6 shows a top view of the path of the optical beam along its broad side as it passes through the coupling optics in accordance with the present invention.

FIG. 6 shows the output beam 50 and the coupling optics 20 from the same perspective as that of FIG. 4. In this view, the nearly collimated, diffraction limited optical beam 50 of FIG. 4 is focused to a spot that is one focal length (1.45 mm in this case) beyond lens 22. The beam then diverges to a diameter of 450 mm at a distance of 14.5 mm from lens 22. Placing the second lens 24, which is a 13.05 mm focal length cylinder lens, at a distance of 14.5 mm from the first lens 22 would collimate the optical beam 50. The third lens 26, which is a 4.5 mm lens, would thereafter focus the broad side of the optical beam 50 into the optical fiber 30. This arrangement matches the large collimated diode output to the fiber output.

This configuration will be stabilized by the fiber grating 32, which will selectively feed back at those low divergence angles that will couple to the fiber. In the absence of such feedback, the diode output in FIG. 4 would be increased to approximately 12 degrees, full width at half maximum. This would result in a spot size at the fiber 30 that is much larger than the aperture of the fiber. It is anticipated that a sufficiently high fiber reflectivity will drive the diode output into the stable resonator mode described with respect to FIG. 6. Fiber gratings at wavelengths including 980 nm, with reflectivity ranging from a few percent to 100%, can be obtained from several suppliers, including 3M Specialty Optical Fibers, 420 Frontage Road, West Haven, Conn. 06516.

According to the present embodiment, efficient fiber coupling is allowed because of the external resonator formed by the fiber grating 32 in the optical fiber 30 and the rear facet 12 of the broad area laser diode 10, which act as two nodes of the external resonator. To optimize the performance of this resonator, the invention is preferably implemented such that the first, second and third lenses 22, 24, and 26, as well as the front facet 14 of the broad area laser diode, have anti-reflection (AR) coatings. In addition, the rear facet 12 of the broad area laser diode 10 preferably has a high-reflection (HR) coating, and the end facet of the fiber 30 is angle-cleaved to minimize reflection.

Implementation of this resonator permits efficient fiber coupling while limiting the diode wavelength to the reflection bandwidth of the grating. Thus, the wavelength of the optical beam 50 is stabilized under the present invention. The laser diode device of the present invention thereby provides a system with minimal mechanical complexity that also functions to stabilize the wavelength of the optical beam and optimize the beam quality of the optical beam.

What is claimed is:

1. A fiber-coupled optical source, comprising:
   a broad area laser diode that, without external feedback, operates in multiple spatial modes for generating an optical beam having a beam profile and a wavelength;
   an optical fiber coupled to receive the optical beam and having a fiber profile;
   coupling optics coupled to receive the optical beam from the broad area laser diode and manipulate the beam profile of the optical beam to preferentially match a single spatial mode of the broad area laser diode to the fiber profile, wherein the coupling optics comprises first, second, and third lenses, and the first and third lenses are aspheric and
   fiber grating located within the optical fiber for providing a reflection at a predetermined wavelength for the single spatial mode such that the predetermined wavelength and the single spatial mode of the optical beam are stabilized.

2. The fiber-coupled optical source of claim 1, wherein the broad area laser diode comprises an aperture having a broad dimension and a narrow dimension, and wherein the aperture emits the optical beam having a fast axis and a slow axis.

3. The fiber-coupled optical source of claim 1, wherein the broad area laser diode comprises a multi-stripe diode array.

4. The fiber-coupled optical source of claim 1, wherein the broad area laser diode comprises a tapered amplifier.

5. The fiber-coupled optical source of claim 1, wherein the broad area laser diode comprises:
   a front facet;
   a rear facet; and
   a rectangular aperture formed in the front facet for providing the optical beam that is asymmetric.

6. The fiber-coupled optical source of claim 1, wherein the first and third lenses are antireflection coated.

7. A fiber-coupled optical source, comprising:
   a broad area laser diode that, without external feedback, operates in multiple spatial modes for generating an optical beam having a beam profile and a wavelength;
   an optical fiber coupled to receive the optical beam and having a fiber profile;
   coupling optics coupled to receive the optical beam from the broad area laser diode and manipulate the beam profile of the optical beam to preferentially match a single spatial mode of the broad area laser diode to the fiber profile, wherein the coupling optics comprises first, second, and third lenses, and wherein the second lens is a cylinder lens having an antireflection coating; and fiber grating located within the optical fiber for providing a reflection at a predetermined wavelength for the single spatial mode such that the predetermined wavelength and the single spatial mode of the optical beam are stabilized.

8. The fiber-coupled optical source of claim 7, wherein:

the first and third lenses are aspheric;

the second lens is a cylinder lens; and the first, second, and third lenses are antireflection coated.

9. A fiber-coupled optical source, comprising:

a broad area laser diode that, without external feedback, operates in multiple spatial modes for generating an optical beam having a beam profile and a wavelength;

an optical fiber coupled to receive the optical beam and having a fiber profile;

coupling optics coupled to receive the optical beam from the broad area laser diode and manipulate the beam profile of the optical beam to preferentially match a single spatial mode of the broad area laser diode to the fiber profile, wherein the coupling optics comprises first, second, and third lenses, wherein the first lens receives the optical beam from the broad area laser diode, collimates the fast axis, and converges the slow axis; the second lens receives the optical beam from the first lens and collimates the slow axis; and the third lens receives the optical beam from the second lens and converges the fast and slow axes to approximately match the beam profile to the fiber profile; and fiber rating located within the optical fiber for providing a reflection at a predetermined wavelength for the single spatial mode such that the predetermined wavelength and the single spatial mode of the optical beam are stabilized.

10. A fiber-coupled optical source, comprising:

a broad area laser diode that, without external feedback, operates in multiple spatial modes for generating an optical beam having a beam profile and a wavelength, the broad area laser diode comprising a front facet, a rear facet, and a rectangular aperture formed in the front facet such that the optical beam is asymmetric and has a fast axis and a slow axis;

an optical fiber coupled to receive the optical beam, the optical fiber having a fiber profile;

coupling optics for receiving the optical beam from the broad area laser diode and manipulating the beam profile to approximately match a single spatial mode of the broad area laser diode to the fiber profile, said coupling optics comprising first, second, and third lenses, wherein the first and third lenses are aspheric and fiber grating formed in the optical fiber for providing a reflection at a predetermined wavelength for said single spatial mode such that the predetermined wavelength and the single spatial mode of the optical beam are stabilized.

11. The fiber-coupled optical source of claim 10, wherein the first and third lenses of the coupling optics are antireflection coated.

12. A fiber-coupled optical source, comprising:

a broad area laser diode that, without external feedback, operates in multiple spatial modes for generating an optical beam having a beam profile and a wavelength, the broad area laser diode comprising a front facet, a rear facet, and a rectangular aperture formed in the front facet such that the optical beam is asymmetric and has a fast axis and a slow axis;

an optical fiber coupled to receive the optical beam, the optical fiber having a fiber profile;

coupling optics for receiving the optical beam from the broad area laser diode and manipulating the beam profile to approximately match a single spatial mode of the broad area laser diode to the fiber profile, said coupling optics comprising first, second, and third lenses, wherein the second lens is a cylinder lens having an antireflection coating; and fiber grating formed in the optical fiber for providing a reflection at a predetermined wavelength for said single spatial mode such that the predetermined wavelength and the single spatial mode of the optical beam are stabilized.

13. A fiber-coupled optical source, comprising:

a broad area laser diode that, without external feedback, operates in multiple spatial modes for generating an optical beam having a beam profile and a wavelength, the broad area laser diode comprising a front facet, a rear facet, and a rectangular aperture formed in the front facet such that the optical beam is asymmetric and has a fast axis and a slow axis;

an optical fiber coupled to receive the optical beam, the optical fiber having a fiber profile;

coupling optics for receiving the optical beam from the broad area laser diode and manipulating the beam profile to approximately match a single spatial mode of the broad area laser diode to the fiber profile, said coupling optics comprising first, second, and third lenses, wherein the first lens receives the optical beam from the broad area laser diode, collimates the fast axis, and converges the slow axis; the second lens receives the optical beam from the first lens and collimates the slow axis; and the third lens receives the optical beam from the second lens and converges the fast and slow axes to approximately match the beam profile to the fiber profile; and fiber grating formed in the optical fiber for providing a reflection at a predetermined wavelength for said single spatial mode such that the predetermined wavelength and the single spatial mode of the optical beam are stabilized.

14. The fiber-coupled optical source of claim 10, wherein the broad area laser diode comprises a multi-stripe diode array.

15. The fiber-coupled optical source of claim 10, wherein the broad area laser diode comprises a tapered amplifier.

16. The fiber-coupled optical source of claim 12, wherein the front facet of the broad area laser diode and the fiber grating define a resonator.

17. The fiber-coupled optical source of claim 13, wherein the fiber grating reflects a portion of the optical beam back through the coupling optics to the broad area laser diode to create feedback.

* * * * *

UNITED STATES PATENT AND TRADEMARK OFFICE
CERTIFICATE OF CORRECTION

PATENT NO. : 6,125,222
DATED : September 26, 2000
INVENTOR(S) : Anthon

Page 1 of 1

It is certified that error appears in the above-identified patent and that said Letters Patent is hereby corrected as shown below:

Column 3,
Line 3, delete "lasers" and insert therefore -- laser --

Column 6,
Line 30, delete "aspheric and" and insert therefore -- aspheric; and --

Column 7,
Line 51, delete "aspheric and" and insert therefor -- aspheric; and --

Column 8,
Line 50, delete "claim 10" and insert therefore -- claim 13 --
Line 53, delete "claim 10" and insert therefore -- claim 13 --
Line 55, delete "claim 12" and insert therefore -- claim 13 --
Line 58, delete "claim 13" and insert therefore -- claim 16 --

Signed and Sealed this

Eleventh Day of September, 2001

Attest:

*Nicholas P. Godici*

Attesting Officer

NICHOLAS P. GODICI
*Acting Director of the United States Patent and Trademark Office*